United States Patent [19]

Lowrey et al.

[11] Patent Number: 4,999,160
[45] Date of Patent: Mar. 12, 1991

[54] ALUMINUM ALLOY CONTAINING COPPER, SILICON AND TITANIUM FOR VLSI DEVICES

[75] Inventors: Tyler A. Lowrey; Trung T. Doan, both of Boise, Id.

[73] Assignee: Micron Technology, Inc., Boise, Id.

[21] Appl. No.: 445,969

[22] Filed: Dec. 4, 1989

[51] Int. Cl.$^5$ .................... H01L 23/48; B32B 15/04
[52] U.S. Cl. .................... 420/529; 148/438; 428/650; 437/14; 437/194; 437/197
[58] Field of Search .................... 428/650; 420/529; 437/197, 194, 14; 148/438

[56] References Cited

U.S. PATENT DOCUMENTS

| | | | |
|---|---|---|---|
| 4,401,489 | 8/1983 | Arai et al. | 148/438 |
| 4,527,184 | 7/1985 | Fischer | 357/67 |
| 4,566,177 | 1/1986 | Van De Ven et al. | 437/194 |
| 4,704,369 | 11/1987 | Alvis et al. | 437/14 |
| 4,828,794 | 5/1989 | Scott et al. | 420/529 |
| 4,902,582 | 2/1990 | Inoue | 428/650 |

OTHER PUBLICATIONS

Gardner et al., in Proc. IEEE—VLSI—Conf., 1984, p. 68.

Rey et al., Ibid, p. 139.

Primary Examiner—Upendra Roy
Attorney, Agent, or Firm—Angus C. Fox, III; Stanley Protigal

[57] ABSTRACT

An improved aluminum alloy from which interconnect lines of VLSI integrated-circuit devices may be fabricated. The alloy, which is comprised of aluminum, copper, titanium and silicon, is not only resistant to electromigration and stress cracking, but produces silicon precipitate crystals which are much finer that those produced by aluminum-copper-silicon alloys under the hot-and-cold temperature cycling that is required by contemporary semiconductor fabrication processes. These fine silicon precipitate crystals are much less likely to destroy the electrical continuity of an alloy-to-silicon junctions within an integrated-circuit device, even where dimensions of such junctions have been reduced. Although other alloy proportions are usable, optimal alloy percentages are deemed to be 0.5 to 3 percent copper by weight and 0.05 to 1 percent titanium by weight, the percentage of silicon by weight being determined by the saturation concentration of the alloy at the maximum process temperature (generally within a range between 0.5 to 2 percent).

4 Claims, 8 Drawing Sheets

ALUMINUM ALLOY CONTAINING COPPER, SILICON AND TITANIUM FOR VLSI DEVICES

FIELD OF THE INVENTION

The present invention relates to semiconductor manufacturing technology and, more specifically, to the composition of metal alloys from which interconnect lines are formed for sub-micron manufacturing processes.

BACKGROUND OF THE INVENTION

Aluminum-silicon alloys have been used for transistor gates and interconnect lines within integrated circuits for years. The primary advantages of the alloy are that it is inexpensive, easy to etch and a relatively good conductor. The reason that silicon is alloyed with the aluminum is that during glassing encapsulation operations, temperatures typically range between 400° to 560° C. Within this temperature range, aluminum, if not alloyed with silicon in order to achieve the solubility limit at the maximum process temperature, tends to diffuse into adjacent silicon regions of the circuit, destroying the semiconductor status of the silicon material so invaded. Aluminum-silicon alloys having a silicon content of 0.5 to 2 percent by weight are commonly used.

Although saturating aluminum with silicon solves the diffusion problem, another problem is created which particularly manifests itself as device dimensions are shrunk. High temperatures inherent in contemporary manufacturing processes causes the silicon within the saturated aluminum-silicon alloy to precipitate, especially at junctions between the alloy and silicon regions. In fact, epitaxial growth of monocrystalline silicon can actually occur at such junction regions, with the alloy contributing the silicon as growth progresses. As silicon precipitates or grows epitaxially in junction regions where electrical connections have been made, the quality of the connections decreases, often to the point of total failure. FIG. 1 is a 1,980× photomicrograph of silicon precipitate crystals that remain on a silicon substrate following the dissolution of an adjacent 1 percent silicon-aluminum alloy layer after the substrate and alloy layer were maintained at 400° C. for one hour. It will be noted that a large percentage of the crystals are of relatively uniform size; the remainder are considerably larger. FIG. 2 is a 15,000× view of some of the precipitate crystals shown in FIG. 1.

Semiconductor manufacturers have solved the problem of silicon precipitates by depositing thin barrier layers on top of the contact region silicon. These barrier layers prevent the migration of aluminum atoms, which eliminates the need to incorporate silicon in the aluminum alloy used for interconnect lines. The silicon precipitate problem is thus solved. However, the deposition of the barrier layer adds times, complexity and cost to the fabrication process.

Hot and cold temperature cycling inherent in the manufacturing process can also create stresses that cause aluminum-silicon alloys to crack. Cracks in interconnect lines are hardly acceptable, as cracks may result in open circuits.

In addition, aluminum interconnect lines, even when alloyed with silicon, are likely to fail in use due to current-induced mass transport of aluminum atoms from one part of the interconnect line to another. The underlying physical phenomenon which induces such failure is generally termed "electromigration". Electromigration occurs in a current-carrying conductive material maintained at elevated temperature as a result of the combined effects of direct momentum exchange from the moving electrons and the influence of the applied electric field. Failures attributable to electromigration generally result either from the complete removal of a portion of an interconnect line (an open circuit) or the buildup of material between previously-isolated conductive paths (a short circuit). However, the protective ability of an overlying protective layer, such as an encapsulating insulating layer, may also be impaired or fractured as a result of material removal or build-up. Such an impairment or fracturization of the protective layer may then subject the circuitry to deleterious environmental conditions (e.g. humidity) which might hasten component failure.

The problems of stress-cracking and electromigration heretofore described may be largely alleviated by the use of copper-doped aluminum interconnect lines. Irving Ames and his coworkers at IBM Corporation discovered that a percentage of copper approximately in the range of about 0.1 to 10 percent by weight composition was sufficient to virtually eliminate the electromigration effect in aluminum-alloy interconnect lines, particularly if the alloy was annealed at a temperature within the range of 250° to 560° C. This discovery is described in U.S. Pat. No. 3,879,840. It was subsequently determined that copper-doped aluminum interconnect lines were less likely to undergo stress cracking under temperature cycling. Although attempts have been made to reduce electromigration susceptibility in aluminum-silicon alloy interconnect lines by incorporating a small percentage of titanium in the alloy, the results were not uniformly successful. For this reason, aluminum-silicon-titanium alloys are not commonly used as interconnect lines within integrated circuits.

Although the doping of aluminum interconnect lines with copper ameliorates the problems of stress cracking and electromigration, it exacerbates the problem of silicon precipitation at silicon-to-metal junctions. This fact is demonstrated by FIG. 3, which is a 2,000× photomicrograph of silicon precipitate crystals that remain on a silicon substrate following the dissolution of an adjacent 1 percent silicon–0.5 percent copper-aluminum alloy layer after the substrate and alloy layer were maintained at 400° C. for one hour (the same high-temperature step experienced by the substrate and alloy layer of FIGS. 1 and 2). It will be noted that the ratio of large to small crystals has increased substantially. Therefore, the possibility of a metal to silicon junction failure is substantially increased. FIG. 4 is a 15,000× view of some of the precipitate crystals shown in FIG. 3. FIG. 5 is a photomicrograph of the cross-section of a DRAM cell. The photo is particulary noteworthy because it shows the junction 51 between a doped silicon substrate 52 and an aluminum-copper-silicon alloy bit line 53, the junction 51 having been rendered useless by the precipitation of silicon crystals. The micrograph of FIG. 6 shows a similar bit-line connection region following the removal of the metal with an acid bath etch. Three silicon crystals 61A, 61B and 61C remain on the substrate 62 in what was the metal-to-substrate contact region, with the largest crystal 61A displaying the rather obvious shape of epitaxially-grown, mono-crystalline silicon. The precipitation problem associated with aluminum-copper-silicon alloys at alloy-to-silicon junctions has heretofore prevented the scaling down of such junction regions, since junction surface area was required to be of sufficient size to cope with any silicon precipitation that was likely to occur at the contact site.

What is needed is an improved aluminum alloy for interconnect lines which possesses both acceptable resistance to electromigration, and improved silicon precipitation characteristics.

SUMMARY OF THE INVENTION

The present invention provides an aluminum alloy which possesses the characteristics required for interconnect lines used in a VLSI integrated circuit constructed on a silicon substrate. The alloy consists essentially of 0.5 to 2 percent silicon by weight, 0.5 to 3 percent copper by weight, and 0.05 to 1 percent titanium by weight. Not only is the alloy is resistant to electromigration and stress cracking, but the titanium acts as a crystal grain refiner. That is to say that although silicon precipitation during temperature cycling is not eliminated, the silicon crystals that do form are of uniformly small size. Hence, even with greatly-reduced device dimensions, they tend not to interfere with electrical conductivity at alloy-to-silicon junctions.

The use of the improved aluminum alloy eliminates the need for the barrier layer for contact diameters within the range of 1.2 to 2.0 microns. For circuitry having contact opening diameters in this range, fabrication costs may be significantly reduced by relying on the improved aluminum alloy disclosed in the subject application. For contact openings having a diameter less than 1.2 microns, though, a barrier layer process is required because even the small-grained silicon crystal precipitates are large enough to interfere with proper aluminum-to-silicon contact.

BRIEF DESCRIPTION OF THE PHOTOMICROGRAPHS

Figure 3:
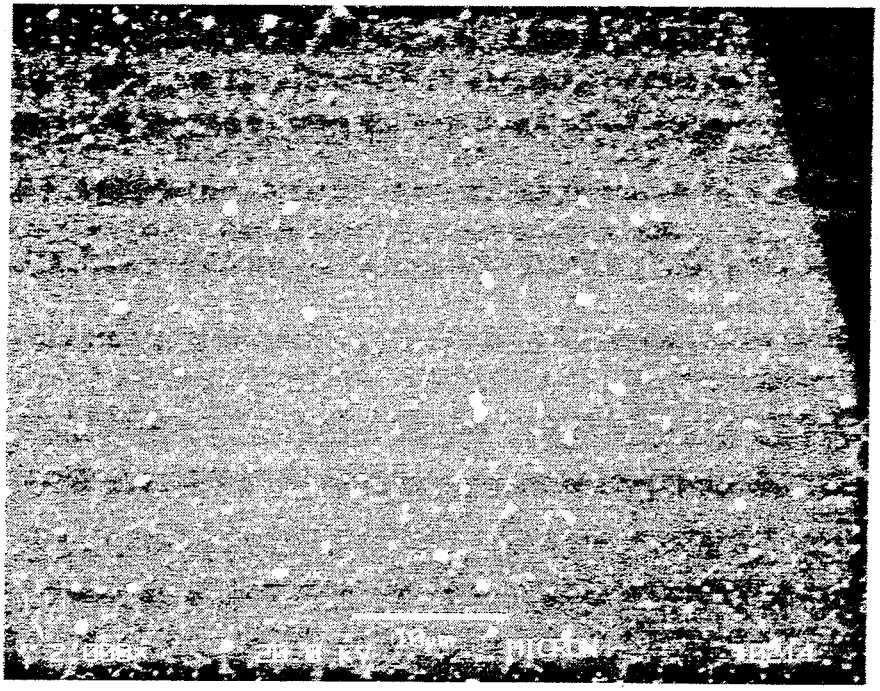
Figure 4:
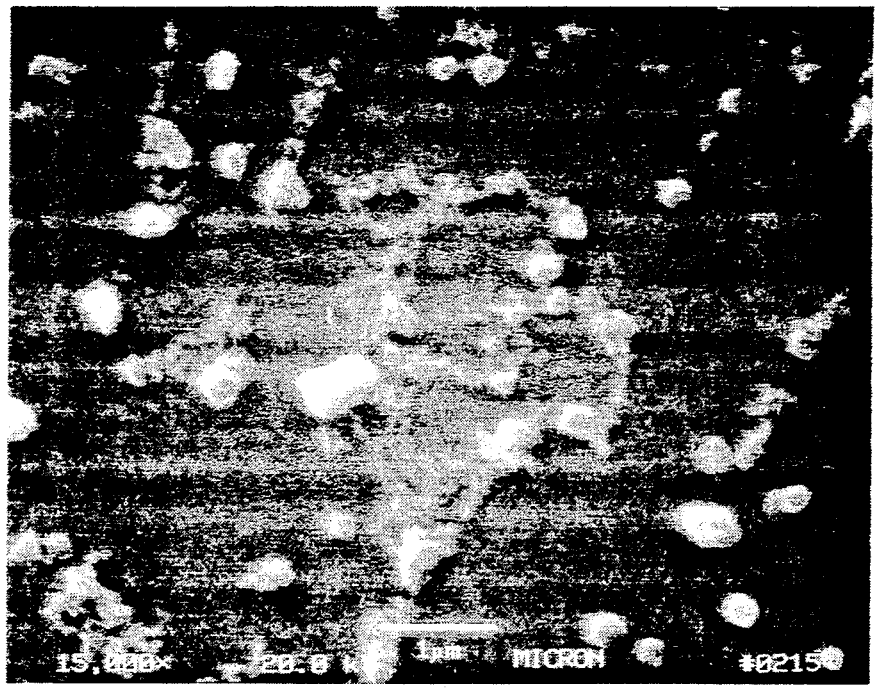
Figure 5:
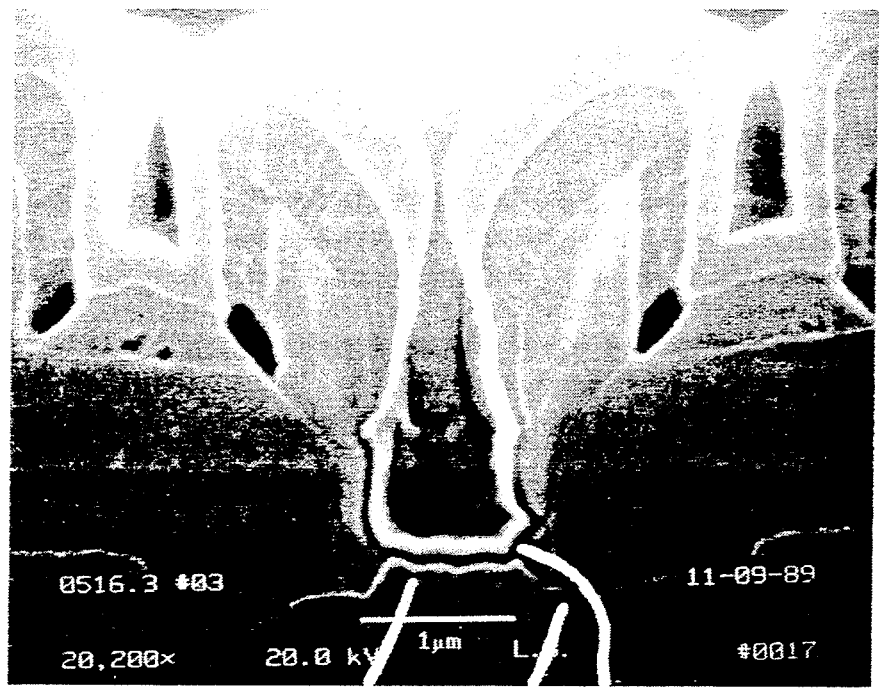
Figure 6:
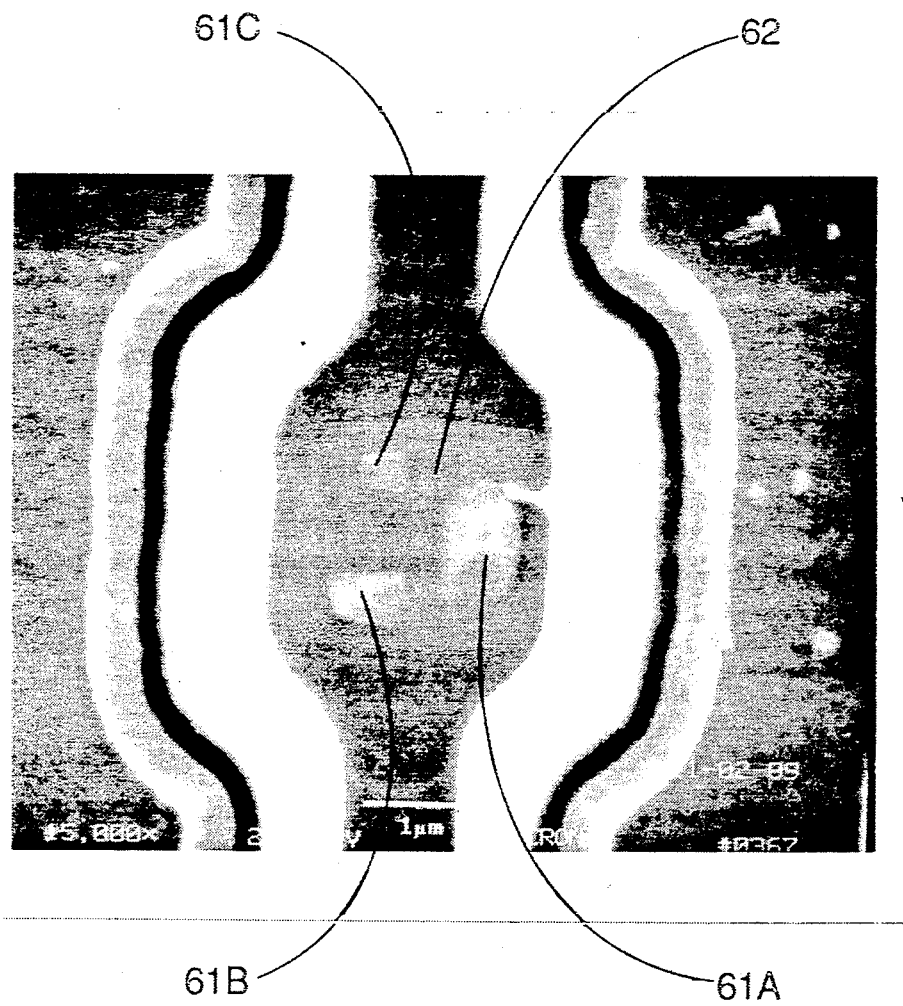

FIG. 3, which is a 2,000× photomicrograph of silicon precipitate crystals that remain on a silicon substrate following the dissolution of an adjacent aluminum-copper-silicon alloy layer after the substrate and alloy layer were maintained at 400° C. for one hour;

FIG. 4 is a 15,000× view of some of the precipitate crystals shown in FIG. 3;

FIG. 5 is a photomicrograph of the cross-section of a DRAM cell, showing the junction between a doped silicon substrate and an aluminum-copper-silicon alloy bit line after the cell was maintained at 400° C. for one hour;

FIG. 6 is a photomicrograph in top-plan view of the bit-line connection region of a DRAM cell similar to that of FIG. 5, following the removal of the metal with an acid bath etch.

Figure 7:
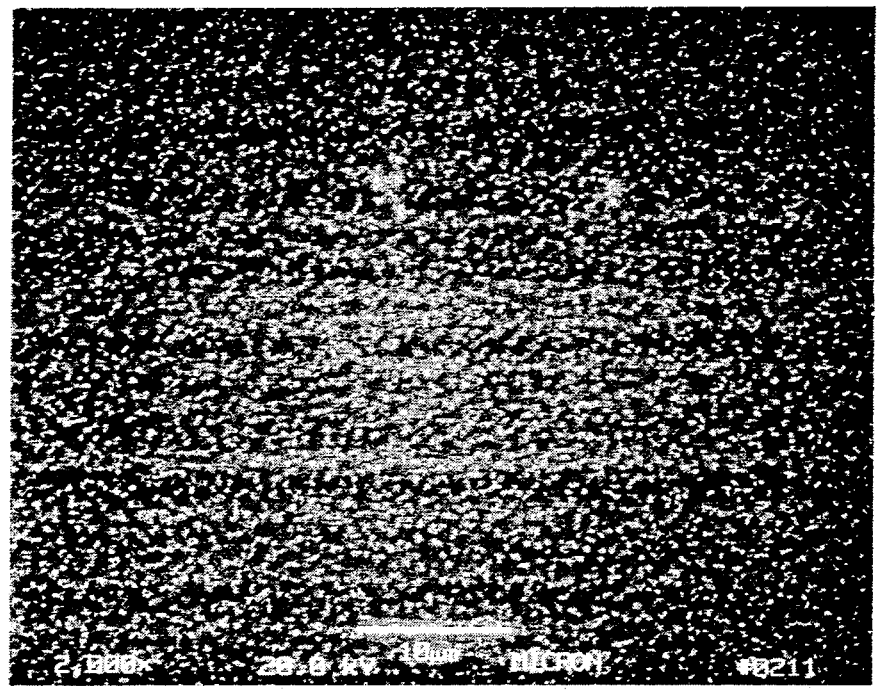
Figure 8:
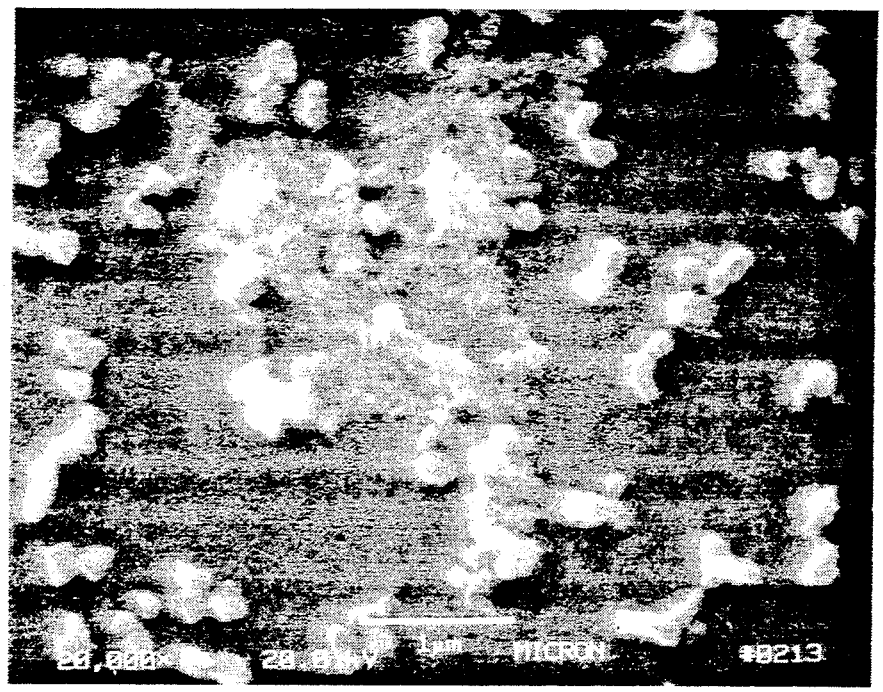

FIG. 7 is a 2,000× photomicrograph of silicon precipitate crystals that remain on a silicon substrate following the dissolution of an adjacent aluminum-copper-titanium-silicon alloy layer after the substrate and alloy layer were maintained at 400° C. for one hour;

FIG. 8 is a 15,000× view of some of the precipitate crystals shown in FIG. 7.

PREFERRED EMBODIMENT OF THE INVENTION

Figure 1:
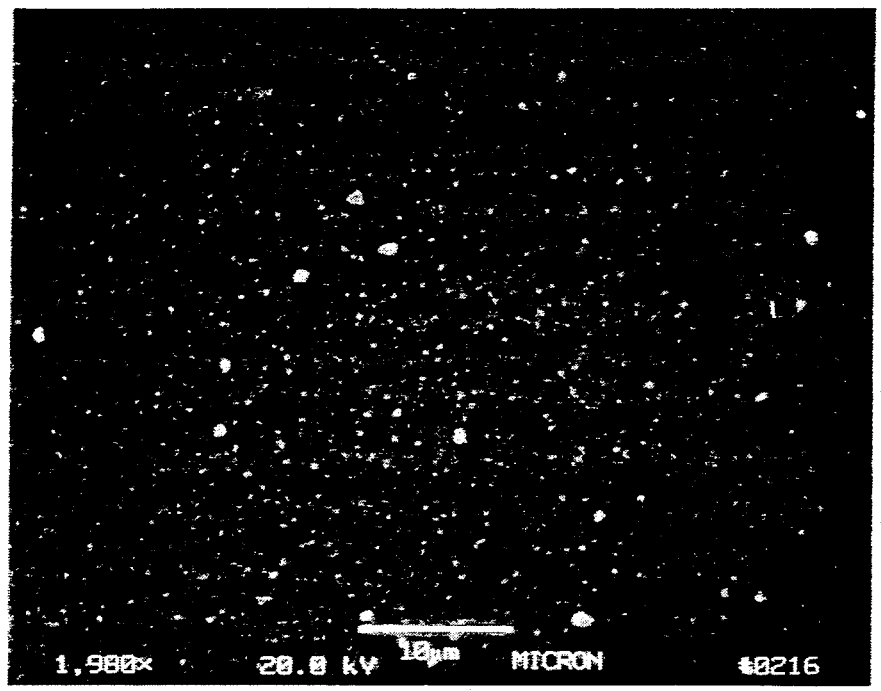
FIG. 1 is a 1,980× photomicrograph of silicon precipitate crystals that remain on a silicon substrate following the dissolution of an adjacent aluminum-silicon alloy layer after the substrate and alloy layer were maintained at 400° C. for one hour.
Figure 2:
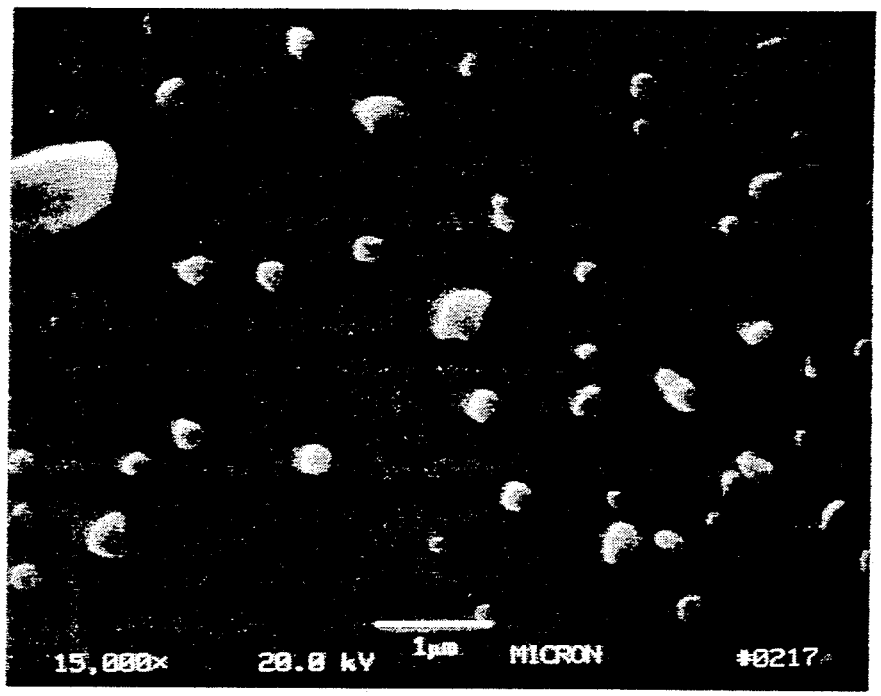
FIG. 2 is a 15,000× view of some of the precipitate crystals shown in FIG. 1.

Referring now to FIG. 7, silicon precipitate crystals that remain on a silicon substrate following the dissolution of an adjacent aluminum-copper-titanium-silicon alloy layer after the substrate and alloy layer were maintained at 400° C. for one hour are shown magnified 2,000 times. FIG. 8 is a view of some of those same precipitate crystals at a magnification of 15,000×. The composition of this particular alloy was 0.5 percent copper by weight, 0.15 percent titanium by weight, and 1 percent silicon by weight. Compared with the silicon precipitate crystals of the aluminum-silicon alloy of FIGS. 1 and 2, the crystals of the aluminum-copper-titanium-silicon alloy are much finer. The comparison between the precipitate crystals of the aluminum-copper-silicon alloy of FIGS. 3 and 4 those of the aluminum-copper-titanium-silicon of FIGS. 7 and 8 is even more dramatic.

Given the much finer grain of silicon precipitate crystals, the possibility of a alloy-to-silicon junction failure is greatly reduced. The fine-grain characteristic of the improved alloy therefore permits further downsizing of such junction regions, with a corresponding improvement in circuit density.

Although precipitate crystals from only a single alloy composition are shown in this document, a range of values are deemed usable for copper, titanium and silicon composition by weight. The percentage of silicon in the improved aluminum alloy may range between 0.5 and 2 percent by weight; the percentage of copper may range between 0.5 to 3 percent by weight; and the percentage of titanium may range between 0.05 and 1 percent by weight. However, the optimum concentration of silicon within the alloy will be equal to the saturation concentration of silicon within said alloy at the maximum process temperature.

Not only is the improved alloy superior to both aluminum-silicon and aluminum-copper-silicon alloys in terms of silicon precipitate crystal grain size, but it is also resistant to electromigration and stress cracking.

Although only a single embodiment of the improved alloy has been examined and described in detail herein, it will be apparent to one skilled in the art that the alloy may be created using proportions of silicon, copper and titanium within the ranges disclosed herein without departing from the spirit and the scope of the invention as claimed.

We claim:

1. An improved aluminum alloy for VLSI integrated-circuit interconnect lines consisting essentially of copper, titanium and silicon having copper between 0.5 to 3 percent by weight, a maximum of 2 percent silicon and 1 percent titanium.

2. The improved aluminum alloy of claim 1, wherein the amount of titanium in said alloy is within a range of 0.05 to 1 percent titanium.

3. The improved aluminum alloy of claim 2, wherein the amount of silicon in said alloy is within a range of 0.5 to 2 percent.

4. The improved aluminum alloy of claim 2, wherein the amount of silicon in said alloy is equal to the saturation concentration of silicon within said alloy at the maximum process temperature.

* * * * *

UNITED STATES PATENT AND TRADEMARK OFFICE
CERTIFICATE OF CORRECTION

PATENT NO. : 4,999,160
DATED : March 12, 1991
INVENTOR(S) : Tyler A. Lowrey et al.

It is certified that error appears in the above—identified patent and that said Letters Patent is hereby corrected as shown below:

Title page, item [57]
In the Abstract, line 3, delete "is comprised" and insert -- consists essentially --;

Column 3, line 17, after "alloy," please delete -- is --;

Column 4, line 20, after "4," please insert -- and --;

Column 4, line 24, delete "a" and insert -- an --.

Signed and Sealed this

Twenty-second Day of February, 1994

Attest:

BRUCE LEHMAN

Attesting Officer

Commissioner of Patents and Trademarks